United States Patent [19]

Armacost et al.

[11] Patent Number: 5,885,899
[45] Date of Patent: Mar. 23, 1999

[54] METHOD OF CHEMICALLY MECHANICALLY POLISHING AN ELECTRONIC COMPONENT USING A NON-SELECTIVE AMMONIUM HYDROXIDE SLURRY

[75] Inventors: Michael David Armacost, Wallkill; David Mark Dobuzinsky, Hopewell Junction, both of N.Y.; Jeffery Peter Gambino, Gaylordsville, Conn.; Mark Anthony Jaso, Yorktown Heights, N.Y.

[73] Assignee: International Business Machines Corporation, Armonk, N.Y.

[21] Appl. No.: 557,224

[22] Filed: Nov. 14, 1995

[51] Int. Cl.⁶ .................................................. H01L 21/461
[52] U.S. Cl. ...................... 438/645.1; 438/697; 252/79.1
[58] Field of Search ............................. 156/636.1, 645.1; 252/79.1; 437/228

[56] References Cited

U.S. PATENT DOCUMENTS

| | | | |
|---|---|---|---|
| 4,962,064 | 10/1990 | Haskell et al. | 437/228 |
| 4,992,135 | 2/1991 | Doan | 437/228 |
| 5,169,491 | 12/1992 | Doan | 156/636 |
| 5,244,534 | 9/1993 | Yu et al. | 156/636 |
| 5,272,117 | 12/1993 | Roth et al. | 437/228 |
| 5,275,963 | 1/1994 | Cederbaum et al. | 437/48 |
| 5,310,451 | 5/1994 | Tejwani et al. | 156/630 |
| 5,328,553 | 7/1994 | Poon | 156/636.1 |
| 5,478,436 | 12/1995 | Winebarger et al. | 156/636.1 |
| 5,514,245 | 5/1996 | Doan et al. | 437/228 |
| 5,612,254 | 3/1997 | Mu et al. | 437/195 |

OTHER PUBLICATIONS

NL8200782, Abstract Only, "Planarising the Surface of Semiconductor Bodies With Grooves".

*Primary Examiner*—R. Bruce Breneman
*Assistant Examiner*—Anita Alanko
*Attorney, Agent, or Firm*—Steven Capella; Dale M. Crockatt

[57] ABSTRACT

A method of forming interlevel studs in an insulating layer on a semiconductor wafer. First, a conformal BPSG layer is formed on a Front End of the Line (FEOL) semiconductor structure. Vias are opened through the BPSG layer to the FEOL structure. A layer of poly is formed (deposited) on the BPSG layer, filling the vias. The poly layer may be insitu doped poly or implanted after it is deposited. The wafer is annealed to diffuse dopant from the poly to form diffusions wherever the poly contacts the substrate. A non-selective slurry of colloidal silica and at least 1% ammonium hydroxide is used to chem-mech polish the poly from the BPSG layer and, simultaneously, planarize the BPSG layer.

14 Claims, 2 Drawing Sheets

METHOD OF CHEMICALLY MECHANICALLY POLISHING AN ELECTRONIC COMPONENT USING A NON-SELECTIVE AMMONIUM HYDROXIDE SLURRY

FIELD OF THE INVENTION

The present invention relates to an improved surface preparation technique for semiconductor chips and, more particularly, to the planarization of such semiconductor chip surfaces according to an improved chemical-mechanical polishing technique.

BACKGROUND OF THE INVENTION

A semiconductor chip is an array of devices with conducting terminals that are interconnected by wiring patterns of metal strips. In Very Large Scale Integration (VLSI) chips, these metal wiring patterns are multilayered. Each wiring layer is separated from other conducting layers by layers of insulating material. Interconnections between different wiring layers are made by through holes (vias) that are etched through the insulating material layers.

As VLSI chip features shrink and the number of wiring layers increases, surface irregularities in each layer translate to subsequent layers, making each subsequent layer's surface even more irregular. These irregularities distort shapes formed on the surface, making level-to-level alignment difficult. In some cases, this distortion is so severe as to make it nearly impossible to adequately replicate (print) the intended shape or align printing masks to previous levels. One way surface irregularities were reduced was to fill the vias with conductive material (i.e., from studs in the vias) before printing the wiring pattern. However, the raised wire shapes still left caused irregularities in subsequent layers' surfaces. Therefore, techniques have been developed that are used at various levels to create a nearly perfectly flat or planar surface in order to achieve high dimensional and geometric accuracy. These techniques are known, in the art, as planarization.

One such planarization process is Chemical-Mechanical Polishing, also known as Chem-Mech Polishing or CMP. CMP involves applying an abrasive in a solution (known as a slurry) to the wafer surface and, then, polishing the surface. Additives in the solution chemically react with the surface material, softening it, and, then, the highest features in the softened surface are removed by the abrasive particles.

When the layer to be polished is a uniform material with an irregular surface topography, CMP is a relatively simple process. Thus, CMP is widely used in the prior art to planarize insulating dielectrics in the top most semiconductor chip layers, i.e, those closest to the chip's upper surface. These top most layers are sometimes called Back End Of the Line (BEOL) layers, likening to the semiconductor chip manufacturing process to an assembly line where these steps occur at the back of the line. Likewise, early processing steps are at Front End Of the Line (FEOL) and early layers are FEOL layers; middle steps/layers are Middle Of the Line (MOL).

CMP also is used to form studs in interlevel vias through an already planarized dielectric layers between conducting layers such as between two wiring layers. To form studs: first, the dielectric layer is planarized using CMP; next, the via pattern is opened through the dielectric layer; a layer of conducting material, such as polysilicon (also referred to as 'poly') or tungsten, is formed over the patterned dielectric; and, finally, the layer of conducting material is polished down to the dielectric layer so that the conducting material remains only in the vias.

Unfortunately, after CMP, scratches may remain in the polished dielectric layer. Further, the polishing step may have failed to remove 100% of the surface irregularities caused by underlying layers. Further, because of depressions left in the surface, CMP may not have to remove all unwanted conducting material. Finally, each polishing step introduces some non-uniformity in the polished layer. These shortcomings may cause chip defects, e.g., leakages and shorts, surface irregularities, and non-uniform dielectric. Furthermore, CMP stud formation is a time consuming process.

PURPOSES OF THE INVENTION

It is a purpose of the present invention to improve semiconductor chip yield.

It is another purpose of the present invention to simplify chip manufacture.

It is yet another purpose of the present invention to improve surface planarity of semiconductor chip layers.

It is yet another purpose of the present invention to simplify planarization of insulator layers formed in manufacturing semiconductor chips while improving chip yield.

SUMMARY OF THE INVENTION

The invention encompasses a method of forming interlevel studs in an insulating layer on a semiconductor wafer. First, a conformal BPSG layer is formed on a Front End of the Line (FEOL). Semiconductor structure vias are opened through the BPSG layer to the FEOL structure. A layer of poly is formed on the BPSG layer, filling the vias. The deposited poly may be doped poly or implanted after it is deposited. The wafer is annealed to diffuse dopant from the poly to form diffusions wherever the poly contacts the substrate. A non-selective slurry of colloidal silica and at least 1% ammonium hydroxide is used to chem-mech polish the poly from the BPSG layer and, simultaneously, planarize the BPSG layer.

DESCRIPTION OF THE PREFERRED EMBODIMENTS

Figure 1:
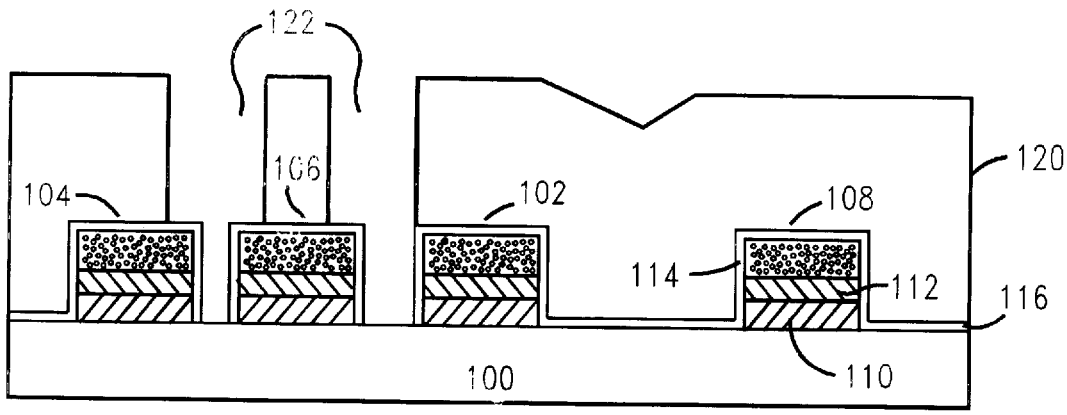
FIG. 1 is a cross-sectional representation of a semiconductor chip subsequent to forming openings (vias) in array areas according to the preferred embodiment of the present invention.

In the first step, as represented in FIG. 1 by a cross section of a typical semiconductor chip on a semiconductor wafer, vias are formed through an insulating layer. Typically, as provided in this example, the semiconductor wafer or substrate 100 is silicon. Field Effect Transistor (FET) gates 102, 104 and wiring 106, 108 are formed on the silicon substrate 100. Each gate 102, 104 or wire 106, 108 is a stack of layers, wherein the bottom layer 110 of each individual stack is poly. A layer of WSi$_2$ 112 caps the poly layer 110. The WSi$_2$ layer 112 is capped with a Si$_3$N$_4$ 114. The entire wafer is covered by a nitride etch-stop layer 116.

Thus, having formed a typical FEOL structure, interlevel poly studs, connecting device structures to subsequent wiring layers, may be made and the insulating layer planarized according to the preferred embodiment of the present invention.

First, a conformal layer of insulating material 120 is formed on the FEOL structure. Although the preferred insulating material is Boro-Phospho-Silicate Glass (BPSG), any suitable insulating material may be substituted. Normally, the insulating layer 120 would be chem-mech polished to planarize its surface, and then, studs would be formed in vias through the BPSG layer 120. However, chem-mech polishing requires removal of several thousand angstroms of the BPSG layer 120. As a result, there is normally a significant BPSG layer 120 thickness variation across the wafer. This thickness non-uniformity makes via etching more difficult and unreliable because the time required to etch vias through the layer varies with the thickness. Consequently, allowing enough time to etch through the layer 120 in one wafer area may cause over-etching in another and under-etching in still another. However, the stud formation method of the present invention avoids this wafer-wide thickness variation and minimizes problems associated therewith.

According to the present invention, instead of planarizing the BPSG layer 120 before forming vias, the via pattern 122 is defined, photolithographically, and etched in the unplanarized layer 120, as represented in FIG. 1. The BPSG layer 120, as grown, has a relatively uniform thickness across the wafer. Thus, via etch time is relatively uniform across the wafer. So, vias 122 are defined using a standard print and etch photolithographic technique, practiced in the art for via formation.

Figure 2:
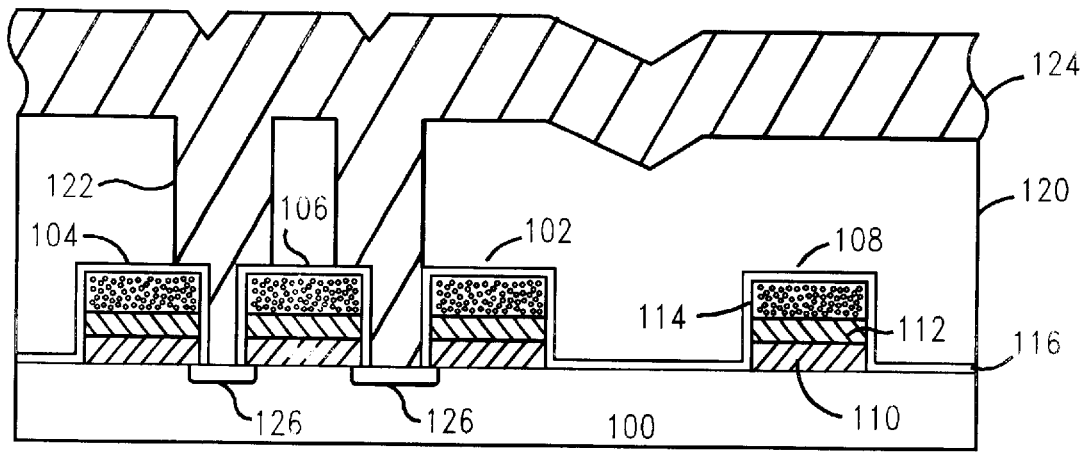
FIG. 2 is a cross-sectional representation of the semiconductor chip of FIG. 1 after poly silicon deposition according to the preferred embodiment of the present invention.
Figure 3:
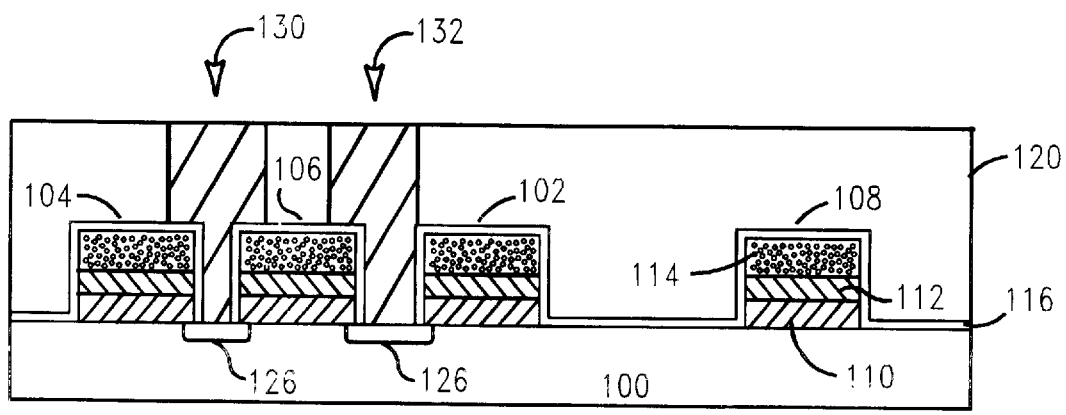
FIG. 3 is a cross-sectional representation of a semiconductor chip after forming vias for metal studs.

Next, in FIG. 2, a layer of poly 124 is formed on the patterned BPSG layer 120, such that the vias 122 are filled with poly. Doped poly may be deposited to form the layer 124, or, alternatively, undoped poly may be deposited and implanted, separately, to insure that the poly filling the vias 122 is doped. Then, the wafer is annealed so that dopant from the doped poly layer 124, or from the implanted poly layer 124 diffuses into the substrate 100 forming diffusions 126. Finally, in FIG. 3, a non-selective slurry and a hard polishing pad are used to chem-mech polish the poly layer 124 and the underlying BPSG insulating layer 120, simultaneously, planarizing the insulation layer 120 forming the poly studs 130, 132.

The preferred slurry for the non-selective polishing step is a silica based slurry containing at least 1% ammonium hydroxide. The preferred particle size is at least 30 nm. The preferred silica is Semisperse SS-312 from Cabot Corporation. Thus, the preferred slurry achieves an identical polishing rate of 250 nm/min for both poly and BPSG. Other slurries may be substituted, provided the substituted slurry achieves a nearly identical polishing rate for both materials. A significant polishing rate difference would result in either leaving residual poly in large unplanarized areas or, a non-planar BPSG surface. Consequently, a slurry with less than 1% ammonium hydroxide or a potassium hydroxide based slurry which has a reduced poly removal rate, therefore, is unsuitable for the present invention.

Figure 4:
FIG. 4 is a profilometer measurement of a surface planarized using a soft pad for chem-mech polish touch-up.
Figure 5:
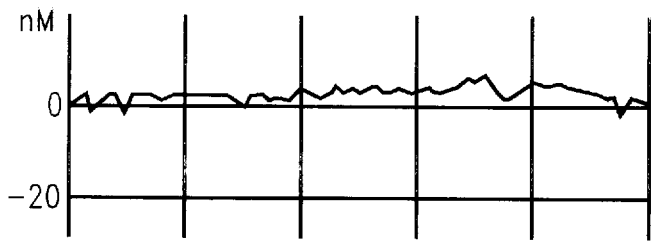
FIG. 5 is a profilometer measurement of a surface similar to FIG. 4, chem-mech polished according to the preferred embodiment of the present invention.

The preferred polishing pad is hard, such as an IC-1000 polishing pad by Rodel. A significantly softer pad may be ineffective in polishing, leaving surface irregularities as represented in the profilometer measurement of FIG. 4. FIG. 4 represents a surface wherein a previously planarized surface was chem-mech polished with a soft pad. In the topography of FIG. 5, the hard pad and non-selective slurry was used to polish an identical surface according to the preferred embodiment of the present invention. The topography of the surface measured in FIG. 5 is significantly more planar than that of FIG. 4.

Thus, the non-selective polishing method of the preferred embodiment of the present invention eliminates a polishing step and a wet etch step, thereby reducing semiconductor chip manufacture time and cost and increasing chip yield. Further, there is no degradation of the BPSG layer for a semiconductor wafer polished according to the preferred method. Finally, the topographical irregularities introduced by polishing with a soft pad are avoided or minimized with the present invention.

While the present invention is described in terms of preferred embodiments, it is understood that numerous variations and modifications will occur to a person skilled in the art without departing in spirit and scope from the claimed invention. It is intended that the scope of the claims include those modifications and variations that fall within the spirit of the invention.

We claim:

1. A method of forming inter-level studs through an insulating layer on a semiconductor wafer, said method comprising the steps of:

a) forming a conformal layer of insulating material on a semiconductor wafer;

b) forming a plurality of vias through said insulating layer;

c) forming layer of a polysilicon conducting material on said conformal insulating layer, said conducting material filling said plurality of vias; and d) using a slurry comprising silica and ammonium hydroxide, which slurry is non-selective to said conductive material and said insulating layer, chem-mech polishing said conductive layer and said insulating layer to a planar surface, such that said conductive material remains only in said plurality of vias.

2. The method of claim 1 wherein the silica is colloidal silica with a particle size greater than 30 nm.

3. The method of claim 2 wherein said slurry contains at least 1% ammonium hydroxide.

4. The method of claim 1 wherein the insulating material is BPSG.

5. The method of claim 4 wherein the polysilicon is doped polysilicon.

6. The method of claim 5 further comprising before the chemmech polishing step (d), the step of:

c1) annealing the wafer such that dopant from the polysilicon layer diffuses into a region under said vias.

7. The method of claim 4 further including, before the step (d) of chem-mech polishing, the steps:

c1) implanting dopant into the polysilicon layer; and c2) annealing the wafer such that said implanted dopant diffuses into a region under said vias.

8. A method of forming inter-level studs through BPSG insulating layer on a semiconductor wafer, said method comprising the steps of:

a) forming a conformal BPSG layer on a semiconductor wafer;

b) forming a plurality of vias through said BPSG layer;

c) forming a polysilicon layer on said conformal BPSG layer, polysilicon filling said plurality of vias; and d) chem-mech polishing said polysilicon layer and said BPSG layer to a planar surface with a slurry comprising silica and at least 1% ammonium hydroxide, and which slurry is non-selective to polysilicon and BPSG, such that polysilicon studs remain in said plurality of vias.

9. The method of claim 8 wherein said silica is colloidal silica having a particle size greater than 30 nm.

10. The method of claim 8 wherein the polysilicon is doped polysilicon, the method further comprising, before the chem-mech polishing step (d), the step of:

c1) annealing the wafer such that dopant from the polysilicon layer diffuses into a region under said vias.

11. The method of claim 8 further including, before the step of chem-mech polishing (d), the steps of:

c1) implanting dopant into the polysilicon layer; and c2) annealing the wafer such that said implanted dopant diffuses into a region under said vias.

12. A method of forming inter-level studs through BPSG layer on a semiconductor wafer, said method comprising the steps of:

a) forming a conformal BPSG layer on a semiconductor wafer;

b) forming a plurality of vias through said BPSG layer;

c) forming a polysilicon layer on said conformal BPSG layer, polysilicon filling said plurality of vias;

d) annealing the wafer such that dopant from the polysilicon layer diffuses into a region under said vias; and e) chem-mech polishing said polysilicon layer and said BPSG layer to a planar surface with a slurry containing (i) at least 1% ammonium hydroxide and (ii) colloidal silica with a particle size of at least 30 nm, such that polysilicon studs remain in said plurality of vias.

13. The method of claim 12 wherein the polysilicon is doped prior to formation of said polysilicon layer.

14. The method of claim 12 further including, before the annealing step (d), the step of:

c1) implanting dopant into the polysilicon layer.

\* \* \* \* \*